United States Patent
Lo et al.

(10) Patent No.: US 12,172,887 B2
(45) Date of Patent: Dec. 24, 2024

(54) SOUND PRODUCING PACKAGE STRUCTURE INCLUDING SOUND PRODUCING MEMBRANES ACTUATED TOWARD CAVITY CENTER

(71) Applicant: xMEMS Labs, Inc., Santa Clara, CA (US)

(72) Inventors: Chiung C. Lo, San Jose, CA (US); Jemm Yue Liang, Sunnyvale, CA (US)

(73) Assignee: xMEMS Labs, Inc., Santa Clara, CA (US)

(*) Notice: Subject to any disclaimer, the term of this patent is extended or adjusted under 35 U.S.C. 154(b) by 663 days.

(21) Appl. No.: 17/343,703

(22) Filed: Jun. 9, 2021

(65) Prior Publication Data
US 2022/0009768 A1   Jan. 13, 2022

Related U.S. Application Data

(60) Provisional application No. 63/050,855, filed on Jul. 12, 2020.

(51) Int. Cl.
| | |
|---|---|
| B81B 7/00 | (2006.01) |
| B81C 1/00 | (2006.01) |
| H04R 1/02 | (2006.01) |
| H04R 7/06 | (2006.01) |
| H04R 7/16 | (2006.01) |
| H04R 1/40 | (2006.01) |
| H04R 19/01 | (2006.01) |
| H04R 19/04 | (2006.01) |

(52) U.S. Cl.
CPC ........ *B81B 7/0058* (2013.01); *B81C 1/00333* (2013.01); *H04R 1/025* (2013.01); *H04R 7/06* (2013.01); *H04R 7/16* (2013.01); *B81B 2201/0257* (2013.01); *B81B 2203/0127* (2013.01); *H04R 1/406* (2013.01); *H04R 19/016* (2013.01); *H04R 19/04* (2013.01); *H04R 2201/003* (2013.01)

(58) Field of Classification Search
CPC .......... B81B 7/0058; B81B 2201/0257; H04R 1/025; H04R 1/2826; H04R 1/227; H04R 1/406; H04R 7/06; H04R 7/16; H04R 17/00; H04R 19/005; H04R 19/016; H04R 19/04; H04R 23/02; H04R 2201/003; H04R 2201/028
See application file for complete search history.

(56) References Cited

U.S. PATENT DOCUMENTS 7,221,767 B2 * 5/2007 Mullenborn ........... H04R 19/04
381/174
10,555,091 B2 * 2/2020 Perletti ............... B81C 1/00626
(Continued)

*Primary Examiner* — Ida M Soward
(74) *Attorney, Agent, or Firm* — Winston Hsu

(57) ABSTRACT

A sound producing package structure includes a plurality of chips disposed within a cavity. The chips includes a first chip and a second chip, the first chip includes a first sound producing membrane and a first actuator attached to the first sound producing membrane, and a second chip includes a second sound producing membrane and a second actuator attached to the second sound producing membrane. The first sound producing membrane and the second sound producing membrane are actuated toward a center of the cavity in a synchronous fashion so as to produce a sound pressure.

15 Claims, 11 Drawing Sheets

(56) References Cited

U.S. PATENT DOCUMENTS

| | | | | |
|---|---|---|---|---|
| 2010/0303274 A1* | 12/2010 | Ryan | ............ | H04R 1/222 |
| | | | | 381/361 |
| 2011/0198714 A1* | 8/2011 | Yang | ............ | B81B 7/0061 |
| | | | | 257/E21.52 |
| 2012/0250897 A1* | 10/2012 | Michel | ............ | H04R 19/04 |
| | | | | 381/111 |
| 2013/0241045 A1* | 9/2013 | Goida | ............ | H04R 19/04 |
| | | | | 438/51 |
| 2013/0320463 A1* | 12/2013 | Chang | ............ | H01L 24/97 |
| | | | | 438/51 |
| 2015/0023523 A1* | 1/2015 | Elian | ............ | H04R 1/406 |
| | | | | 381/91 |
| 2015/0162264 A1* | 6/2015 | Chang | ............ | H01L 23/28 |
| | | | | 257/774 |
| 2016/0241953 A1* | 8/2016 | Elian | ............ | H04R 1/406 |
| 2017/0318396 A1* | 11/2017 | Brioschi | ............ | H04R 31/006 |
| 2019/0028815 A1* | 1/2019 | Brioschi | ............ | H04R 3/005 |
| 2019/0144265 A1* | 5/2019 | Chakravarty | ............ | B81C 1/00579 |
| | | | | 257/415 |
| 2019/0144269 A1* | 5/2019 | Rajasekaran | ............ | H01L 21/67 |
| | | | | 257/704 |
| 2020/0092659 A1* | 3/2020 | Perletti | ............ | B81C 1/00626 |

* cited by examiner

US 12,172,887 B2

SOUND PRODUCING PACKAGE STRUCTURE INCLUDING SOUND PRODUCING MEMBRANES ACTUATED TOWARD CAVITY CENTER

CROSS REFERENCE TO RELATED APPLICATIONS

This application claims the benefit of U.S. provisional application No. 63/050,855, filed on Jul. 12, 2020, which is incorporated herein by reference in its entirety.

BACKGROUND OF THE INVENTION

1. Field of the Invention

The present invention relates to a sound producing package structure and a manufacturing method thereof, and more particularly, to a sound producing package structure for protecting a chip having a membrane configured to produce an acoustic wave, and to a manufacturing method thereof.

2. Description of the Prior Art

Since micro sound producing devices, such as MEMS (Micro Electro Mechanical System) microspeakers, can be widely used in various electronic devices due to their small size, micro sound producing devices are developed rapidly in recent years. For example, a MEMS microspeaker may use a thin film piezoelectric material as actuator and a thin single crystal silicon layer as membrane which are formed by at least one semiconductor process.

However, the micro sound producing devices need to be protected due to their small sizes and fragility structures. Therefore, it is necessary to provide a package structure to protect the micro sound producing devices.

SUMMARY OF THE INVENTION

It is therefore a primary objective of the present invention to provide a sound producing package structure for protecting a chip having a membrane configured to produce sound, and provide a manufacturing method of this sound producing package structure.

An embodiment of the present invention provides a sound producing package structure including a plurality of chips disposed within a cavity. The chips includes a first chip and a second chip, the first chip includes a first sound producing membrane and a first actuator attached to the first sound producing membrane, and a second chip includes a second sound producing membrane and a second actuator attached to the second sound producing membrane. The first sound producing membrane and the second sound producing membrane are actuated toward a center of the cavity in a synchronous fashion so as to produce a sound pressure.

An embodiment of the present invention further provides a manufacturing method of a sound producing package structure. The manufacturing method includes: providing a first wall structure; forming a first chip on the first wall structure, wherein the first chip includes a first sound producing membrane and a first actuator attached to the first sound producing membrane; forming a second chip on the first wall structure, wherein the second chip includes a second sound producing membrane and a second actuator attached to the second sound producing membrane; and forming a second wall structure on the first wall structure. A cavity exists between the first wall structure and the second wall structure, the first chip and the second chip are disposed within the cavity, and the first sound producing membrane and the second sound producing membrane are actuated toward a center of the cavity in a synchronous fashion so as to produce a sound pressure.

According to the present invention, the yield rate and the reliability of the sound producing package structure are enhanced, and the size of the sound producing package structure is reduced. In some cases, the sound pressure level of the acoustic wave produced by the sound producing package structure may be enhanced since the sound producing package structure includes a plurality of chips configured to produce the acoustic wave.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
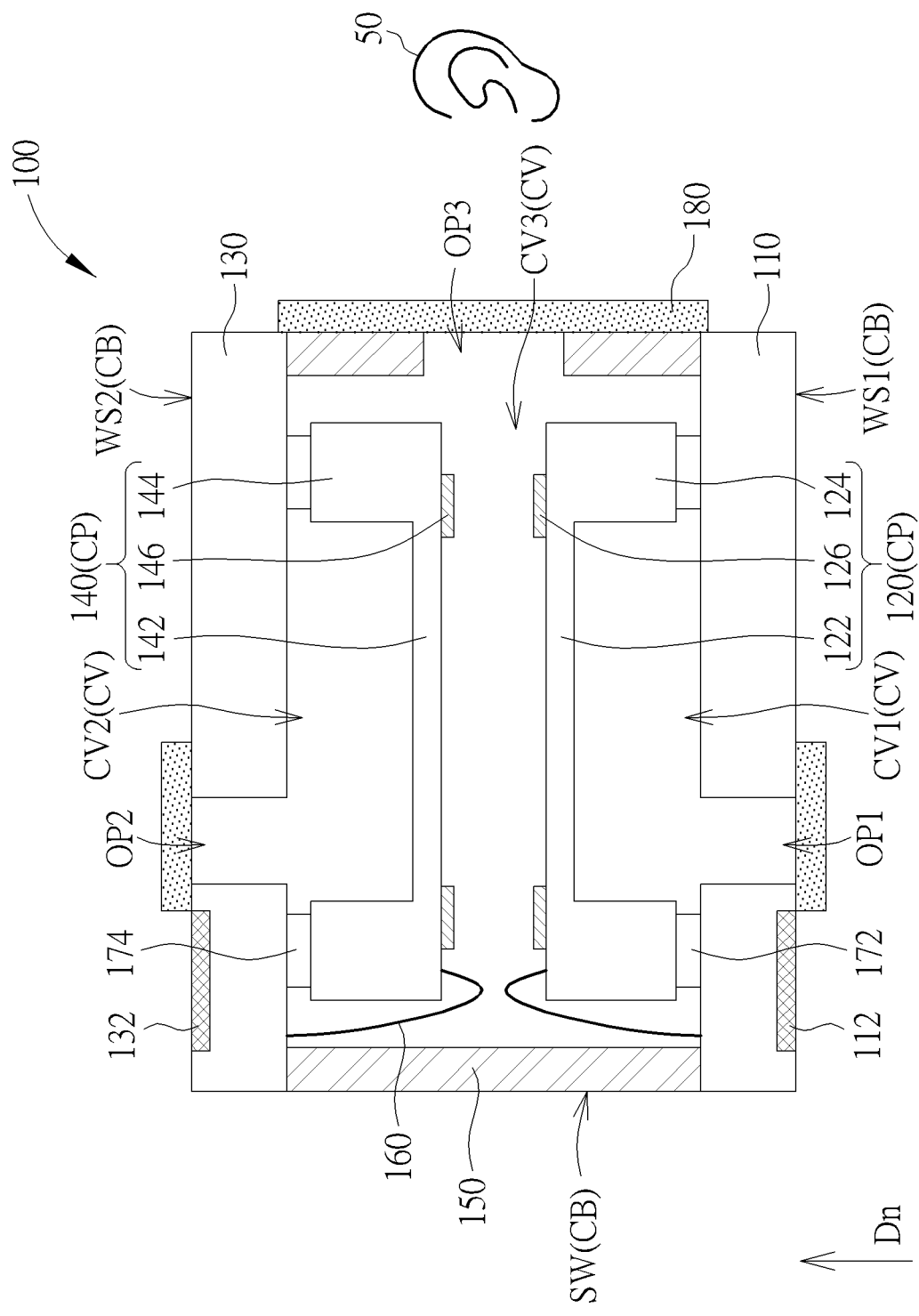
FIG. 1 is a schematic diagram of a cross-sectional view illustrating a sound producing package structure according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof) ", it may be directly on another component, or other component may exist between them. On the other hand, when the component is referred to "directly on another component (or the variant thereof)", any component does not exist between them. Furthermore, when a component A1 is disposed on a component A2, the component A1 may be situated on upper side, lower side, left side, right side or any other suitable side of the component A2.

It will be understood that when an element or layer is referred to as being "connected to" or "contact with" another element or layer, it can be directly connected to (or directly contact with) the other element or layer, or intervening elements or layers may be presented. In contrast, when an element is referred to as being "directly connected to" or "direct contact with" another element or layer, there are no intervening elements or layers presented.

In the following description and in the claims, when "a B1 component is formed by/of B2", B2 exist in the formation of B1 component or B2 is used in the formation of B1 component, and the existence and use of one or a plurality of other features, areas, steps, operations and/or components are not excluded in the formation of B1 component.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

Referring to FIG. 1, FIG. 1 is a schematic diagram of a cross-sectional view illustrating a sound producing package structure according to a first embodiment of the present invention. As shown in FIG. 1, the sound producing package structure 100 includes a chamber CB and a plurality of chips CP disposed in the chamber CB. The chamber CB may include a first wall structure WS1, a second wall structure WS2 and at least one sidewall structure SW, and a space surrounded by the first wall structure WS1, the second wall structure WS2 and the sidewall structure(s) SW is a cavity CV of the chamber CB (i.e., the cavity CV exists between the first wall structure WS1 and the second wall structure WS2), wherein the second wall structure WS2 may be opposite to the first wall structure WS1, the sidewall structure(s) SW may be between the first wall structure WS1 and the second wall structure WS2, and the chips CP may be between the first wall structure WS1 and the second wall structure WS2 and surrounded by the sidewall structure(s) SW (i.e., the chips is disposed within the cavity CV). In this embodiment, the first wall structure WS1 and the second wall structure WS2 may be parallel to each other, but not limited thereto.

The chamber CB may be assembled by a plurality of components. In some embodiments, the first wall structure WS1 may be formed of one or more component(s), the second wall structure WS2 may be formed of one or more component(s), and the sidewall structure(s) SW may be formed of one or more component(s), but not limited thereto. In some embodiments, one component may serve as two or more of the first wall structure WS1, the second wall structure WS2 and the sidewall structure SW, but not limited thereto. For example, in FIG. 1, the chamber CB may be formed of a first substrate 110, a second substrate 130 and at least one spacer 150, and the spacer(s) 150 may be between the first substrate 110 and the second substrate 130, wherein the first substrate 110 may serve as the first wall structure WS1, the second substrate 130 may serve as the second wall structure WS2, and the spacer(s) 150 may serve as the sidewall structure(s) SW, but not limited thereto. In FIG. 1, the spacer 150 may be connected to the first substrate 110 and the second substrate 130 by any suitable adhesive material.

The first substrate 110 and the second substrate 130 may be a hard substrate or a flexible substrate. For instance, the first substrate 110 and the second substrate 130 may individually include silicon, germanium, glass, plastic, quartz, sapphire, polymer, resin, polyimide (PI), polyethylene terephthalate (PET), other suitable material or a combination thereof. Optionally, at least one conductive layer (e.g., at least one metal layer), at least one insulating layer, at least one semiconductor layer or a combination thereof may be included in the first substrate 110 and/or the second substrate 130. For example, the first substrate 110 and the second substrate 130 may be a circuit board including a laminate (e.g. copper clad laminate, CCL), a land grid array (LGA) board or any other suitable board containing conductive material, such that the first substrate 110 and the second substrate 130 may individually include one or more conductive component(s) (such as connecting trace(s) and/or bonding pad(s)).

The spacer 150 may be hard or flexible. For instance, the spacer 150 may include silicon, germanium, glass, plastic, quartz, sapphire, polymer, resin, PI, PET, other suitable material or a combination thereof. In FIG. 1, the spacer 150 may be a board, but not limited thereto. Optionally, at least one conductive layer (e.g., at least one metal layer), at least one insulating layer, at least one semiconductor layer or a combination thereof may be included in the spacer 150. For example, the spacer 150 may be a circuit board including a laminate (e.g. copper clad laminate, CCL), land grid array (LGA) board or any other suitable board containing conductive material, such that the spacer 150 may include one or more conductive component(s) (such as connecting trace(s) and/or bonding pad(s)).

In some embodiments, if the connecting trace is included in the spacer 150 to be electrically connected between the conductive component of the first substrate 110 and the conductive component of the second substrate 130, the adhesive material connected between the first substrate 110 and the spacer 150 and between the second substrate 130 and the spacer 150 may be conductive. In this case, the outer bonding pad (e.g., the outer bonding pads 112 and 132) configured to be electrically connected between the sound producing package structure 100 and an outer device may be optionally included in only one of the first substrate 110, the second substrate 130 or the spacer 150 (e.g., in FIG. 1, the outer bonding pad 112 or the outer bonding pad 132 may be removed based on requirement), but not limited thereto.

The chips CP are configured to produce an acoustic wave, wherein the chips CP may be the same or different. As shown in FIG. 1, the chips CP includes a first chip 120 and a second chip 140, wherein the first chip 120 includes a first membrane (first sound producing membrane) 122 and a first actuator 126 configured to actuate the first membrane 122 to produce the acoustic wave, and the second chip 140 includes a second membrane (second sound producing membrane) 142 and a second actuator 146 configured to actuate the second membrane 142 to produce the acoustic wave. In the operation of the sound producing package structure 100, the acoustic wave is produced due to the movement of the first membrane 122 and the movement of the second membrane 142. For example, in FIG. 1, the first membrane 122 and the second membrane 142 may be actuated to move upwardly and downwardly by the first actuator 126 and the second actuator 146 respectively. Note that, in the present invention, the terms "move upwardly" and "move downwardly" represent that the membrane moves substantially along a direction parallel to a normal direction of the membrane.

The first membrane 122 and the second membrane 142 include any suitable material. In this embodiment, the first membrane 122 and the second membrane 142 may include silicon (e.g., single crystalline silicon or poly-crystalline silicon), silicon compound (e.g., silicon carbide, silicon oxide), germanium, germanium compound (e.g., gallium nitride or gallium arsenide), gallium, gallium compound, any other suitable material or a combination thereof, but not limited thereto.

The first chip 120 may further include a first anchor structure 124 connected to the first membrane 122, and the second chip 140 may further include a second anchor structure 144 connected to the second membrane 142, wherein the first anchor structure 124 and the second anchor structure 144 may be a fixed end (or fixed edge) respecting the first membrane 122 and the second membrane 142 during the operation of the sound producing package structure 100 (i.e., the acoustic wave is produced). Namely, the first anchor structure 124 and the second anchor structure 144 may be immobilized during the operation of the sound producing package structure 100. Thus, the boundary of the first membrane 122 may be defined by the first anchor structure 124, and the boundary of the second membrane 142 may be defined by the second anchor structure 144.

The first actuator 126 and the second actuator 146 may respectively actuate the first membrane 122 and the second membrane 142 to produce the acoustic wave based on received driving signal(s), wherein the driving signal(s) may be transmitted from the outer device to the first actuator 126 and the second actuator 146 through the outer bonding pad(s) 112 and/or 132. The acoustic wave is corresponding to an input audio signal, and the driving signal is corresponding to a sampled value of the input audio signal or a difference between two adjacent sampled values of the input audio signal, wherein the sampled value of the input audio signal represents an instantaneous value of the input audio signal sampled at a sampling time instant. Note that the first actuator 126 and the second actuator 146 may receive the same driving signal or different driving signals, such that the first membrane 122 and the second membrane 142 may be actuated to have the same movement or different movements.

In some embodiments, the acoustic wave, the input audio signal and the driving signal have the same frequency, but not limited thereto. That is to say, the sound producing package structure 100 produces a sound at the frequency of sound (i.e., the sound producing package structure 100 generates the acoustic wave complying with the zero-mean-flow assumption of classic acoustic wave theorems), but not limited thereto.

Alternatively, in some embodiments, the driving signals may make the first membrane 122 and the second membrane 142 generate a plurality of air pulses, each air pulse has a pulse cycle less than a cycle of the acoustic wave and a cycle of the input audio signal, and one wave of the acoustic wave is reproduced by a plurality of air pulses, wherein the pulse cycle of the air pulse is an inverse/reciprocal of a pulse rate of the air pulses, and the cycle of the acoustic wave and the cycle of the input audio signal are inverses/reciprocals of the frequency of the acoustic wave and the frequency of the input audio signal respectively. In this case, if the lengths of the pulse cycles of the air pulses are the same, the number of the air pulses reproducing one wave of the acoustic wave is decreased as the audio frequency of the acoustic wave is increased. In order to make one wave of the acoustic wave be reproduced by the air pulse with the sufficient number, the pulse rate of the air pulses is higher than a maximum human audible frequency or higher than twice of the maximum human audible frequency (the maximum human audible frequency is generally considered to be 20 kHz), but not limited thereto. Furthermore, in some embodiments, according to Nyquist law, in order to avoid frequency spectral aliasing, the pulse rate of the air pulses needs to be at least twice higher than the maximum frequency of the acoustic wave.

The first actuator 126 and the second actuator 146 may be any suitable type actuator, and they may be respectively attached to (e.g., disposed on or disposed in) the first membrane 122 and the second membrane 142 based on their type and/or other requirement. The first actuator 126 and the second actuator 146 may have a high linear electromechanical converting function. In some embodiments, the first actuator 126 and the second actuator 146 may include a piezoelectric actuator, an electrostatic actuator (such as conducting plate), a nanoscopic-electrostatic-drive (NED) actuator, an electromagnetic actuator (such as a planar coil) or any other suitable type actuator, but not limited thereto. For example, the piezoelectric actuator may contain components such as two electrodes and a piezoelectric material layer disposed between the electrodes, wherein the piezoelectric material layer may actuate the membrane based on the driving signals (e.g. the driving voltages) received by the electrodes, but not limited thereto. For example, the electrostatic actuator and the NED actuator may actuate the membrane based on a received driving signal (e.g. the driving voltage) and an electrostatic field (i.e. using the electrostatic force), but not limited thereto. For example, the electromagnetic actuator may actuate the membrane based on a received driving signal (e.g. the driving current) and a magnetic field (i.e. using the electromagnetic force), but not limited thereto.

The chip CP is formed by any suitable manufacturing process. In some embodiments, the chip CP may be formed by at least one semiconductor process, wherein the semiconductor process(es) may be performed on a wafer to form the chip CP, and the wafer may contain silicon (e.g., single crystalline silicon or poly-crystalline silicon), silicon compound (e.g., silicon carbide, silicon oxide), germanium, germanium compound (e.g., gallium nitride or gallium arsenide), gallium, gallium compound, any other suitable material or a combination thereof. For example, the wafer may be a silicon wafer, a silicon on insulator (SOI) wafer, a polysilicon on insulator (POI) wafer, an epitaxial silicon on insulator wafer, or a germanium on insulator (GOI) wafer, but not limited thereto. In some embodiments, the chip CP may be a micro electro mechanical system (MEMS) structure, such that the sound producing package structure 100 is a package structure of the MEMS structure, but not limited thereto. For example, in the first chip 120, an etching process may be performed on the first chip 120 to release the first membrane 122 and form the first anchor structure 124, but not limited thereto. Therefore, due to the semiconductor process, the size of the chip CP (i.e., thickness and/or the lateral dimension) may be decreased.

In some embodiments, the structure and the manufacturing process of the chip CP may be similar to the structure in U.S. application Ser. No. 16/920,384 (proposed by the same applicant); for example, the structure of the membrane may be similar to the structure in U.S. application Ser. No. 16/920,384, but not limited thereto. The structure in U.S. application Ser. No. 16/920,384 is not narrated herein for brevity.

Chips CP may be connected to the first substrate 110 or the second substrate 130. As shown in FIG. 1, the first chip 120 is connected to the first substrate 110 (i.e., the first wall structure WS1) by a first connecting component 172, and the second chip 140 is connected to the second substrate 130 (i.e., the second wall structure WS2) by a second connecting component 174, but not limited thereto. The first connecting component 172 and the second connecting component 174 may individually include an insulating adhesive material and/or a conductive adhesive material, such as glue, epoxy, die attach film (DAF), dry film and/or solder, but not limited thereto. In addition, the material of the first connecting component 172 may be different than or the same as the material of the second connecting component 174.

The material of the conductive component (i.e., the first connecting component 172 and the second connecting component 174) may be related to the electrically connected method between the chip CP and the substrate (i.e., the first substrate 110 or the second substrate 130). For instance, as shown in FIG. 1, if the chip CP is electrically connected to the first substrate 110 or the second substrate 130 through a wire bonding process, the chip CP (e.g., its actuator) is electrically connected to the conductive component (e.g., bonding pad) of the first substrate 110 or the conductive component of the second substrate 130 by a conductive wire 160, and the connecting component may be the insulating adhesive material, but not limited thereto. For instance (e.g., package structure shown in FIG. 6), if the chip CP (e.g., its actuator) is electrically connected to the first substrate 110 or the second substrate 130 through the connecting component (e.g., a flip chip package), the connecting component may be the conductive adhesive material, but not limited thereto.

Moreover, the first membrane 122 may overlap the second membrane 142 in a normal direction Dn of the first substrate 110 (and/or a normal direction of the first membrane 122), to reduce the size of the sound producing package structure 100, but not limited thereto. In FIG. 1, the first membrane 122 may completely overlap the second membrane 142 in the normal direction Dn of the first substrate 110, but not limited thereto.

The cavity CV of the chamber CB is divided into a plurality of sub-cavities by the chips CP. As shown in FIG. 1, the sub-cavities includes a first sub-cavity CV1, a second sub-cavity CV2 and a third sub-cavity CV3, wherein the first chip 120 is between the first sub-cavity CV1 and the third sub-cavity CV3, and the second chip 140 is between the second sub-cavity CV2 and the third sub-cavity CV3. Moreover, in FIG. 1, the first sub-cavity CV1 is between the first membrane 122 of the first chip 120 and the first substrate 110 (i.e., the first wall structure WS1 of the chamber CB), and the second sub-cavity CV2 is between the second membrane 142 of the second chip 140 and the second substrate 130 (i.e., the second wall structure WS2 of the chamber CB), but not limited thereto. In some embodiments, the third sub-cavity CV3 is between the first membrane 122 and the second membrane 142, and/or the third sub-cavity CV3 is between the first sub-cavity CV1 and the second sub-cavity CV2, but not limited thereto.

As shown in FIG. 1, the first membrane 122 has direct contact with the first sub-cavity CV1 and the third sub-cavity CV3 of the chamber CB, the second membrane 142 has direct contact with the second sub-cavity CV2 and the third sub-cavity CV3 of the chamber CB, but not limited thereto. Therefore, when the first membrane 122 is actuated to move, the pressure in the first sub-cavity CV1 and/or the pressure in the third sub-cavity CV3 may be changed; when the second membrane 142 is actuated to move, the pressure in the second sub-cavity CV2 and/or the pressure in the third sub-cavity CV3 may be changed. As the result, the acoustic wave is produced because of movement of the first membrane 122 and/or movement of the second membrane 142.

In particular, the first membrane 122 and the second membrane 142 may be actuated synchronously. As shown in FIG. 1, since the first membrane 122 overlaps the second membrane 142 in the normal direction Dn of the first substrate 110, and the third sub-cavity CV3 is between the first membrane 122 and the second membrane 142 and/or between the first sub-cavity CV1 and the second sub-cavity CV2, the first membrane 122 and the second membrane 142 are actuated toward a center of the cavity CV in a synchronous fashion so as to produce the sound pressure (the acoustic wave).

As shown in FIG. 1, the chamber CB has a first opening OP1, a second opening OP2 and a third opening OP3, the first opening OP1 is connected to the first sub-cavity CV1, the second opening OP2 is connected to the second sub-cavity CV2, and the third opening OP3 is connected to the third sub-cavity CV3. The first opening OP1, the second opening OP2 and the third opening OP3 may be situated at any suitable position. In some embodiments, the first wall structure WS1 or the sidewall structure SW of the chamber CB has the first opening OP1, the second wall structure WS2 or the sidewall structure SW of the chamber CB has the second opening OP2, and the first wall structure WS1, the second wall structure WS2 or the sidewall structure SW of the chamber CB has the third opening OP3. For example, in FIG. 1, the first substrate 110 (i.e., the first wall structure WS1 of the chamber CB) has the first opening OP1, the second substrate 130 (i.e., the second wall structure WS2 of the chamber CB) has the second opening OP2, and the spacer 150 (i.e., the sidewall structure SW of the chamber CB) has the third opening OP3, but not limited thereto.

The acoustic wave produced by the chip(s) CP may propagate outwards to the listener (e.g., the ear 50 shown in FIG. 1) through a sound outlet opening. In some embodiments, in FIG. 1, the third opening OP3 may serve as the sound outlet opening, and the first opening OP1 and the second opening OP2 may serve as back vents, but not limited thereto. In some embodiments, the first opening OP1 and the second opening OP2 may serve as the sound outlet openings, and the third opening OP3 may serve as the back vent, but not limited thereto. That is to say, in FIG. 1, the function of the third opening OP3 connected to the third sub-cavity CV3 is different from the function of the first opening OP1 connected to the first sub-cavity CV1 and the function of the second opening OP2 connected to the second sub-cavity CV2.

In addition, if the third opening OP3 serves as the sound outlet opening, the moving direction of the first membrane 122 and the moving direction of the second membrane 142 are different from a normal direction of the sound outlet opening (i.e., the third opening OP3). Note that the normal direction of the sound outlet opening may be the same as a normal direction of a structure surrounding the sound outlet opening (e.g., in FIG. 1, the normal direction of the third opening OP3 is the same as a normal direction of the spacer 150). For example, the moving direction of the first membrane 122 and the moving direction of the second membrane 142 may be perpendicular to the normal direction of the sound outlet opening (i.e., the third opening OP3), but not limited thereto.

Optionally, an outer casing may exist outside the chamber CB. In the outer casing, there is no air path connected between the sound outlet opening(s) and the back vent(s) of the chamber CB. Thus, the acoustic wave cannot be influenced by the air passing through the back vent(s). In some embodiments, the first sub-cavity CV1 and the second sub-cavity CV2 may be connected through an air path between the outer casing and the chamber CB whether the first opening OP1 and the second opening OP2 serve as the sound outlet openings or the back vents. For example, if the first opening OP1 and the second opening OP2 serve as the sound outlet openings, the outer casing may have a tube (not shown in figures) connected to the first opening OP1 and the second opening OP2, and the tube may also transmit the acoustic wave to the listener from the first opening OP1 and the second opening OP2, but not limited thereto.

Optionally, the sound producing package structure 100 may further include at least one mesh 180, wherein the openings (the first opening OP1, the second opening OP2 and the third opening OP3) may be covered by the mesh 180, such that it is hard for the dust, particles and/or liquid to enter the chamber CB through the openings. In some embodiments, each mesh 180 may cover at least one of the openings. For instance, in FIG. 1, three meshes 180 respectively cover the first opening OP1, the second opening OP2 and the third opening OP3, but not limited thereto. In some embodiments, the mesh 180 may reduce the liquid infiltration due to the design of the surface tension, but the reducing method of the liquid infiltration is not limited thereto. Furthermore, since the mesh 180 has a plurality of pores (e.g., the pore size as small as tens of micrometers is typical to prevent the penetration of the dust, particles and/or liquid), such that the generated acoustic wave still propagates outwards through the mesh 180. In an embodiment, the mesh 180 may include any suitable material which is easy to be patterned and/or to be connected to other structure (e.g., the first substrate 110, the second substrate 130 and/or the spacer 150), such as metal, glass, semiconductor material (e.g., silicon and/or germanium), plastic, fabric, polymer or any combination thereof, but not limited thereto. For example, the mesh 180 may be made of polyester monofilament fibers, and the polyester monofilament fibers are woven with uniform pore size thereby creating consistent acoustic resistance.

Moreover, the sound producing package structure 100 may further include any other required component based on requirement(s).

According to the design of the sound producing package structure 100 of the present invention, the component in the chamber CB (such as the chips CP and/or any other component) may be protected, so as to enhance the yield rate and the reliability. More particularly, the unintended physical and chemical damages on the chips CP may be reduced when the sound producing package structure 100 is employed or when the sound producing package structure 100 is assembled in a product. Furthermore, the adverse impact of the dust, particles and/or liquid on the component in the chamber CB is decreased. On the other hand, in this embodiment, since the chips CP are formed of the semiconductor process, the sound producing package structure 100 may be downsized.

In some embodiments, the sound pressure level (SPL) of the acoustic wave produced by the sound producing package structure 100 may be enhanced since the sound producing package structure 100 includes a plurality of chips CP configured to produce the acoustic wave. For example, if the first membrane 122 of the first chip 120 and the second membrane 142 of the second chip 140 are actuated to make the first sub-cavity CV1 and the second sub-cavity CV2 be compressed (or expanded) simultaneously, the sound pressure level of the acoustic wave is enhanced.

Figure 2:
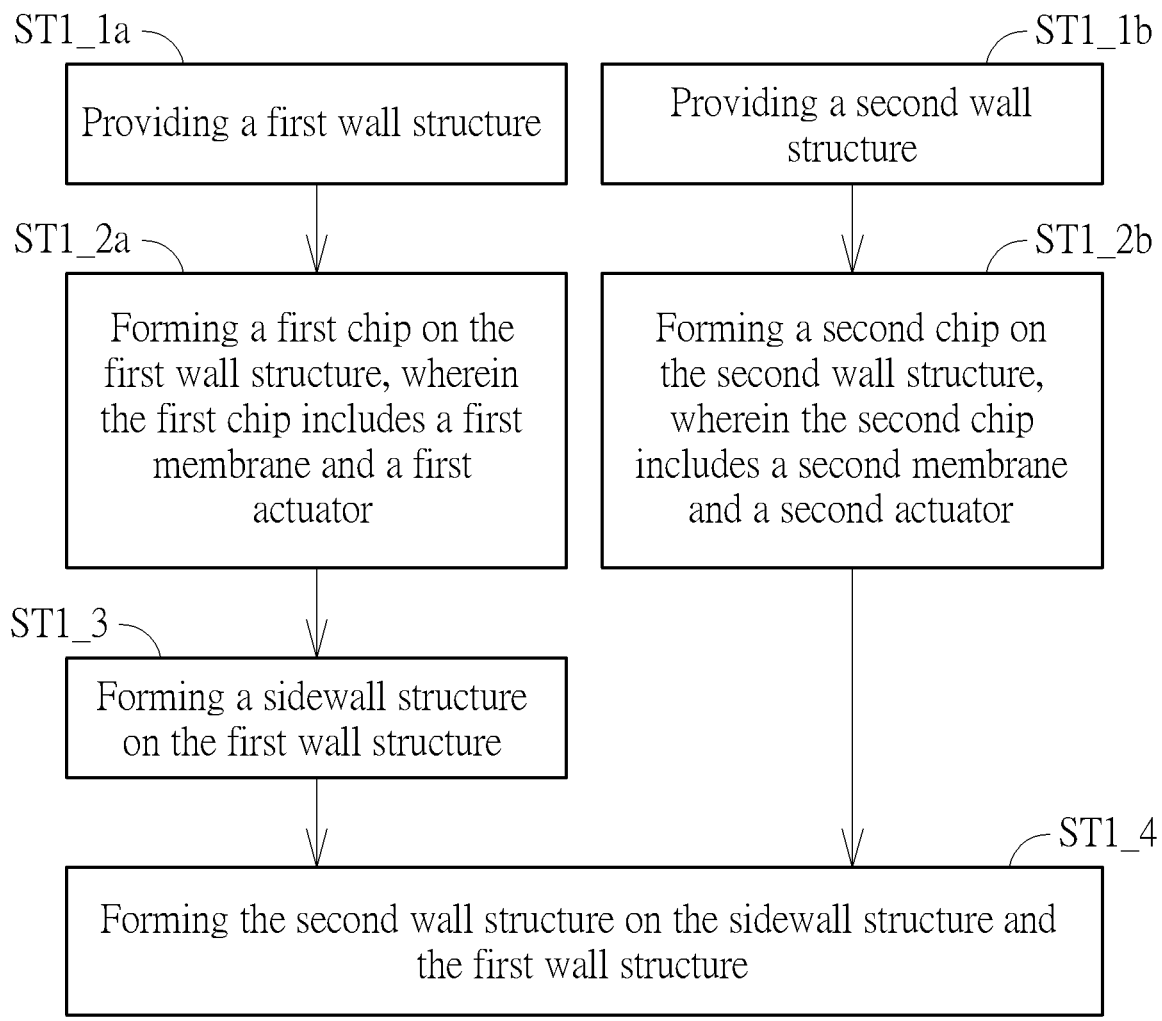
FIG. 2 is a schematic diagram showing a flowchart of a manufacturing method of a sound producing package structure according to an embodiment of the present invention.

Referring to FIG. 2, FIG. 2 is a schematic diagram showing a flowchart of a manufacturing method of a sound producing package structure according to an embodiment of the present invention. It is to be appreciated that the flowchart shown in FIG. 2 is exemplary. In some embodiments, some of the steps may be performed simultaneously, or in a different order than shown in FIG. 2. In some embodiments, before or after one of the existing steps of the manufacturing method shown in FIG. 2, any other suitable step may be added. Regarding the following contents, the manufacturing method shall be described with reference to FIG. 2. However, the manufacturing method is not limited to those example embodiments.

Figure 3:
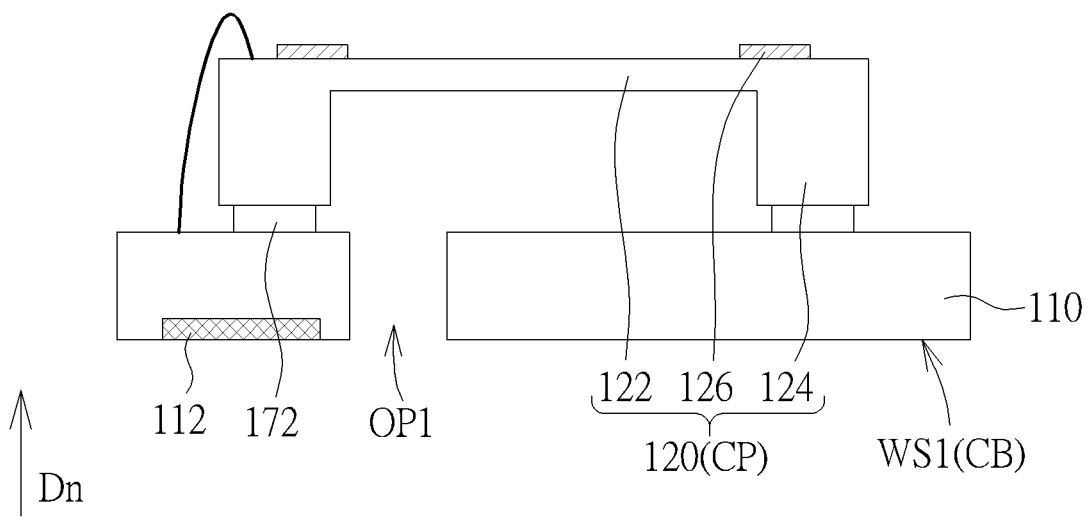
FIG. 3 to FIG. 5 are schematic diagrams illustrating structures at different stages of the manufacturing process of the sound producing package structure according to the first embodiment of the present invention.
Figure 4:
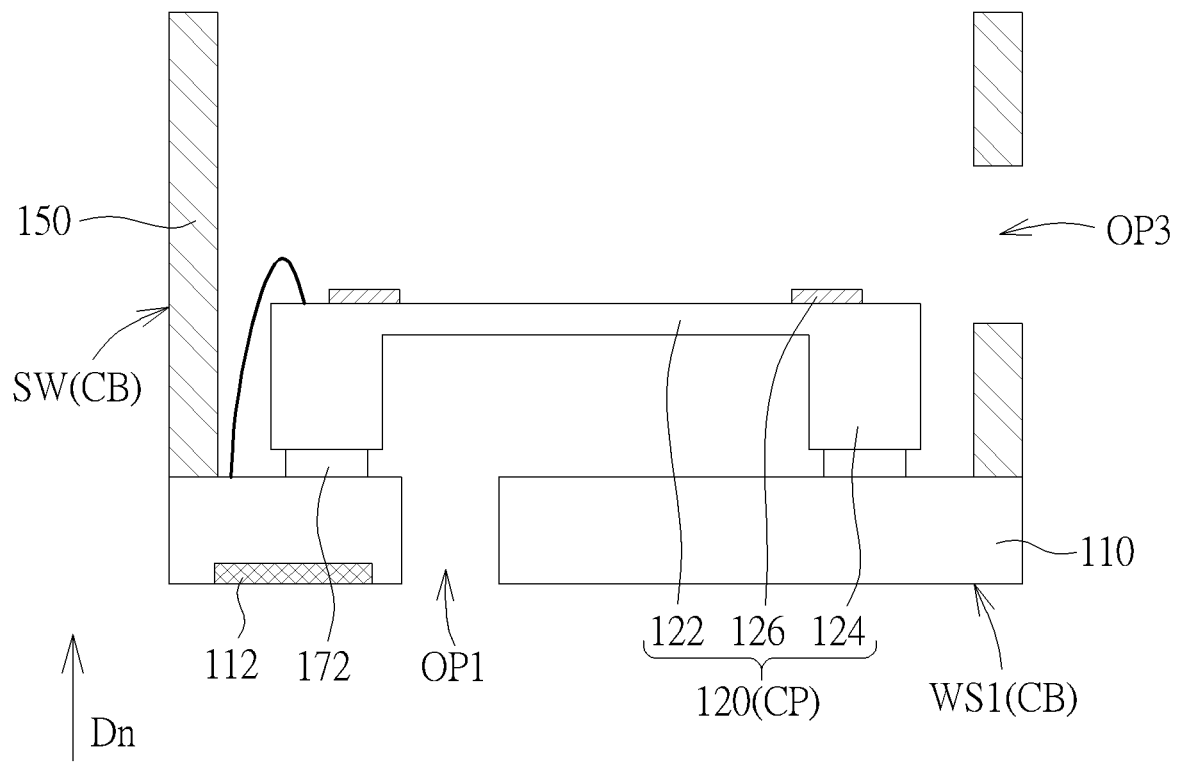
Figure 5:
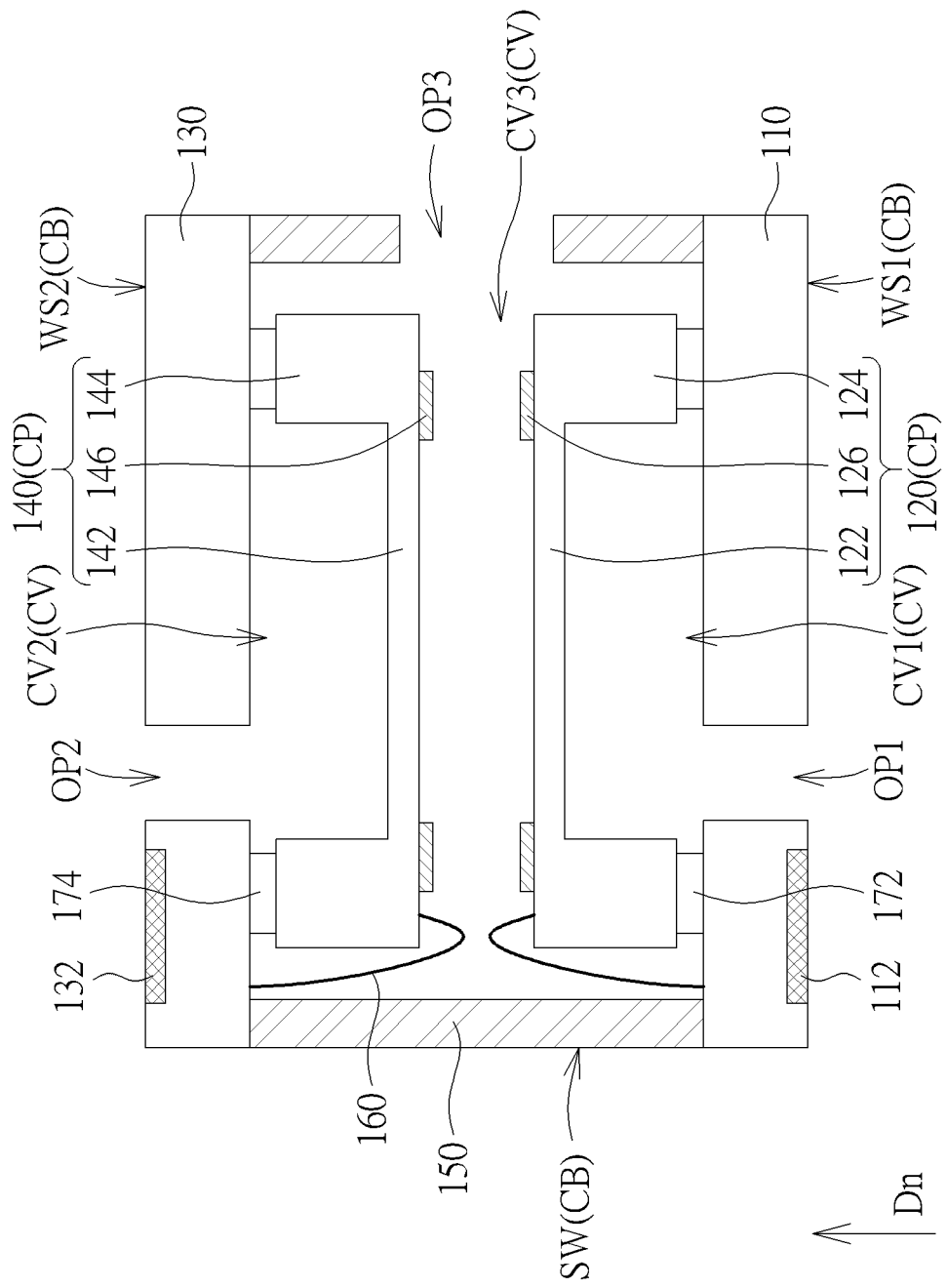

In order to explain the manufacturing method more clearly, FIG. 3 to FIG. 5 and FIG. 1 are referred to further, wherein FIG. 3 to FIG. 5 are schematic diagrams illustrating structures at different stages of the manufacturing process of the sound producing package structure 100 according to the first embodiment of the present invention, and FIG. 1 shows the sound producing package structure 100 according to the first embodiment of the present invention after the manufacturing method is accomplished.

In the step ST1_1a of FIG. 2, the first wall structure WS1 (the first substrate 110) is provided (as shown in FIG. 3). Similarly, in the step ST1_1b of FIG. 2, the second wall structure WS2 (the second substrate 130) is provided. Note that the materials, structures and types of the first substrate 110 and the second substrate 130 can be referred to any suitable embodiment of the present invention, and these will not be redundantly described.

In the step ST1_2a of FIG. 2, the first chip 120 is formed on the first wall structure WS1 (the first substrate 110), wherein the first chip 120 includes the first membrane 122 and the first actuator 126 configured to actuate the first membrane 122 (as shown in FIG. 3). Similarly, in the step ST1_2b of FIG. 2, the second chip 140 is formed on the second wall structure WS2 (the second substrate 130), wherein the second chip 140 includes the second membrane 142 and the second actuator 146 configured to actuate the second membrane 142. Note that the material, structure and type of the chip CP can be referred to any suitable embodiment of the present invention, and these will not be redundantly described.

Any suitable method can be used to make the chips CP be disposed on the first substrate 110 or the second substrate 130. For example, the first chip 120 is connected to the first substrate 110 by the first connecting component 172, and the second chip 140 is connected to the second substrate 130 by the second connecting component 174, but not limited thereto. Note that the material, structure and type of the connecting component can be referred to any suitable embodiment of the present invention, and these will not be redundantly described.

Any suitable method can be used to make the chips CP be electrically connected to the conductive component of the first substrate 110 or the conductive component of the second substrate 130. For instance, in FIG. 3, the conductive wire 160 is formed after disposing the first chip 120, and the first chip 120 is electrically connected to the conductive component of the first substrate 110 through the conductive wire 160 (i.e., the wire bonding process), but not limited thereto. For instance (e.g., package structure shown in FIG. 6), the first chip 120 is electrically connected to the first substrate 110 through the first connecting component 172, the first connecting component 172 may be the conductive adhesive material, but not limited thereto.

In the step ST1_3 of FIG. 2, the sidewall structure SW (the spacer 150) is formed on the first wall structure WS1 (the first substrate 110), as shown in FIG. 4. In FIG. 4, the spacer 150 is outside the first chip 120. Furthermore, the spacer 150 may be connected to the first substrate 110 by any suitable adhesive material. Note that the material, structure and type of the spacer 150 can be referred to any suitable embodiment of the present invention, and these will not be redundantly described.

In the step ST1_4 of FIG. 2, the second wall structure WS2 (the second substrate 130) is disposed (formed) on the sidewall structure SW (the spacer 150) and the first wall structure WS1 (the first substrate 110) to form the chamber CB, wherein the first chip 120 and the second chip 140 are in the chamber CB and between the first wall structure WS1 (the first substrate 110) and the second wall structure WS2 (the second substrate 130), as shown in FIG. 5. In FIG. 5, the first substrate 110 may serve as the first wall structure WS1 of the chamber CB, the second substrate 130 may serve as the second wall structure WS2 of the chamber CB, and the spacer(s) 150 may serve as the sidewall structure(s) SW of the chamber CB, but not limited thereto.

Namely, as shown in FIG. 2, FIG. 4 and FIG. 5, the step ST1_4 represents that the second wall structure WS2 (the second substrate 130) and the second chip 140 are formed on the first wall structure WS1 (the first substrate 110) simultaneously.

Optionally, at least one mesh 180 may be formed to cover the opening(s) of the chamber CB (as shown in FIG. 1), such that it is hard for the dust, particles and/or liquid to enter the chamber CB through the opening(s). In FIG. 1, three meshes 180 respectively cover the first opening OP1, the second opening OP2 and the third opening OP3, but not limited thereto. Note that the material, structure and type of the mesh 180 can be referred to any suitable embodiment of the present invention, and these will not be redundantly described.

The sound producing package structure and the manufacturing method of the sound producing package structure of the present invention are not limited by the above embodiments. Other embodiments of the present invention are described below. For ease of comparison, same components will be labeled with the same symbol in the following. The following descriptions relate the differences between each of the embodiments, and repeated parts will not be redundantly described.

Figure 6:
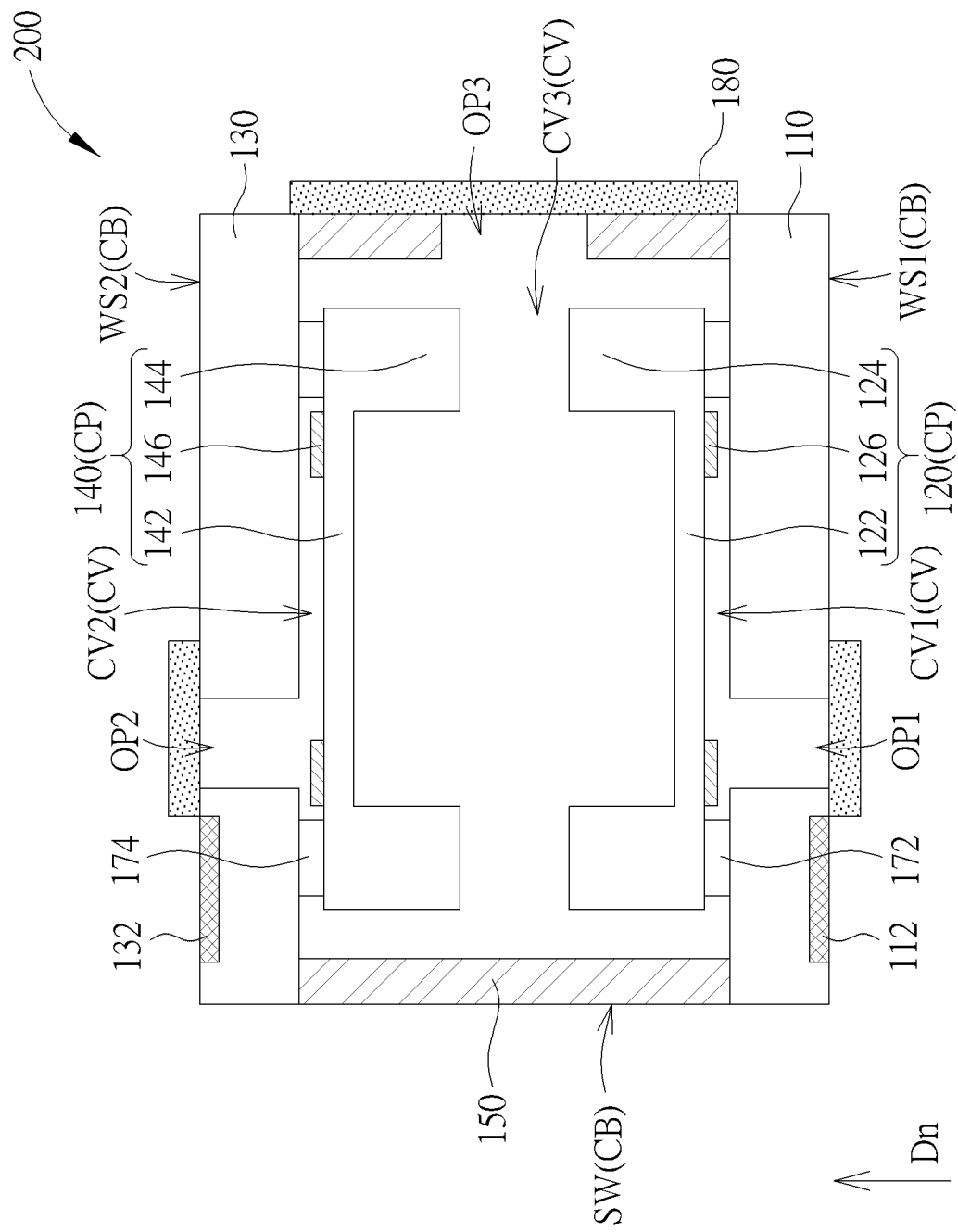
FIG. 6 is a schematic diagram of a cross-sectional view illustrating a sound producing package structure according to a second embodiment of the present invention.

Referring to FIG. 6, FIG. 6 is a schematic diagram of a cross-sectional view illustrating a sound producing package structure according to a second embodiment of the present invention. As shown in FIG. 6, a difference between this embodiment and the first embodiment is that at least one of the chips CP of the sound producing package structure 200 of this embodiment may be disposed upside down, such that its membrane is closer to the substrate. In FIG. 6, the first chip 120 and the second chip 140 are disposed upside down compared with the first embodiment. Furthermore, in this embodiment, the first connecting component 172 and the second connecting component 174 may include the conductive adhesive material (such as, but not limited to, solder), such that the first chip 120 may be electrically connected to the conductive component of the first substrate 110 through the first connecting component 172, and the second chip 140 may be electrically connected to the conductive component of the second substrate 130 through the second connecting component 174, but not limited thereto.

Figure 7:
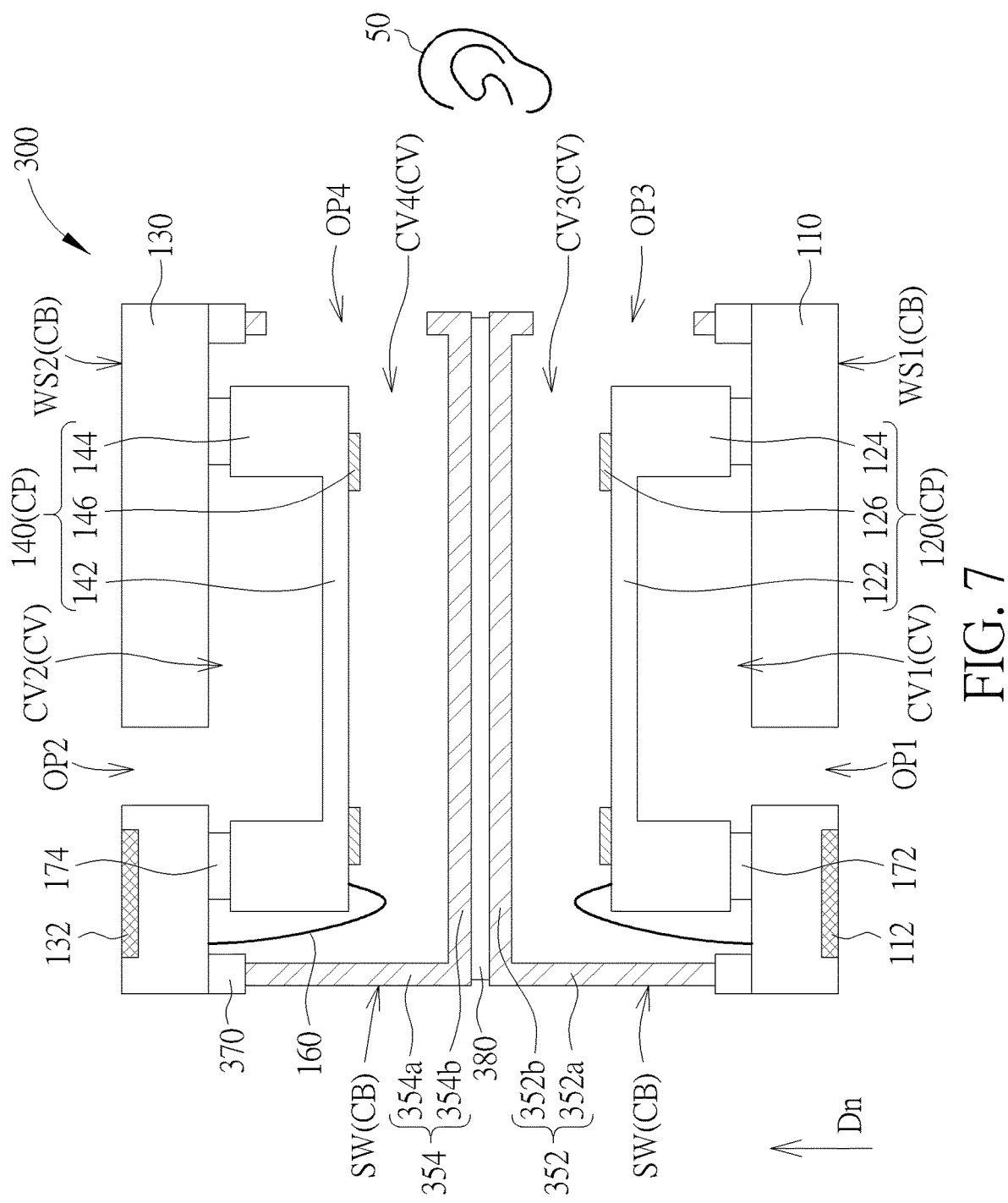
FIG. 7 is a schematic diagram of a cross-sectional view illustrating a sound producing package structure according to a third embodiment of the present invention.

Referring to FIG. 7, FIG. 7 is a schematic diagram of a cross-sectional view illustrating a sound producing package structure according to a third embodiment of the present invention. As shown in FIG. 7, a difference between this embodiment and the first embodiment is that the sub-cavities of the chamber CB of the sound producing package structure 300 further includes a fourth sub-cavity CV4, wherein the third sub-cavity CV3 and the fourth sub-cavity CV4 are between the first membrane 122 and the second membrane 142. In FIG. 7, the first membrane 122 may have direct contact with the first sub-cavity CV1 and the third sub-cavity CV3 of the chamber CB, and the second membrane 142 may have direct contact with the second sub-cavity CV2 and the fourth sub-cavity CV4, but not limited thereto. In addition, the chamber CB further has a fourth opening OP4 connected to the fourth sub-cavity CV4.

The third sub-cavity CV3 and the fourth sub-cavity CV4 may be separated by any suitable structure. In some embodiments, the third sub-cavity CV3 and the fourth sub-cavity CV4 may be separated by one or more cap(s) of the sound producing package structure 300. For instance, in the embodiment shown in FIG. 7, the sound producing package structure 300 may further include a first cap 352 and a second cap 354, wherein the first chip 120 is between the first cap 352 and the first substrate 110, and the second chip 140 is between the second cap 354 and second substrate 130, the first cap 352 and the second cap 354 are respectively connected to the first substrate 110 and the second substrate 130 by adhesive components 370, and a top part 352b of the first cap 352 and a top part 354b of the second cap 354 are connected to each other. In FIG. 7, the top part 352b of the first cap 352 and the top part 354b of the second cap 354 may be connected to each other by an adhesive layer 380, but not limited thereto. Thus, the third sub-cavity CV3 may be between the first chip 120 and the first cap 352, and the fourth sub-cavity CV4 may be between the second chip 140 and the second cap 354. That is to say, the top part 352b of the first cap 352 and the top part 354b of the second cap 354 are between the third sub-cavity CV3 and the fourth sub-cavity CV4.

In some embodiments, even if the third sub-cavity CV3 and the fourth sub-cavity CV4 are separated in the chamber CB, and the first sub-cavity CV1 and the second sub-cavity CV2 are separated in the chamber CB, the third sub-cavity CV3 and the fourth sub-cavity CV4 may be connected to each other outside the chamber CB, and/or the first sub-cavity CV1 and the second sub-cavity CV2 may be connected to each other outside the chamber CB.

In detail, in the outer casing existing outside the chamber CB, there is no air path connected between the sound outlet opening(s) and the back vent(s) of the chamber CB. For example, as shown in FIG. 7, if the third opening OP3 and the fourth opening OP4 may serve as the sound outlet openings, and the first opening OP1 and the second opening OP2 may serve as the back vents, the outer casing may have a tube connected to the third opening OP3 and the fourth opening OP4, such that the third sub-cavity CV3 and the fourth sub-cavity CV4 are connected to each other through an air path in the outer casing and outside the chamber CB, and the acoustic wave produced by the chip(s) CP may propagate outwards to the listener (e.g., the ear 50 shown in FIG. 7) through the third opening OP3 and the fourth opening OP4. In this case, in the outer casing, the first opening OP1 may be connected to or not connected to the second opening OP2 based on requirement(s).

For example, if the first opening OP1 and the second opening OP2 may serve as the sound outlet openings, and the third opening OP3 and the fourth opening OP4 may serve as the back vents, the outer casing may have a tube connected to the first opening OP1 and the second opening OP2, such that the first sub-cavity CV1 and the second sub-cavity CV2 are connected to each other through an air path in the outer casing and outside the chamber CB, and the acoustic wave produced by the chip(s) CP may propagate outwards to the listener through the first opening OP1 and the second opening OP2. In this case, in the outer casing, the third opening OP3 may be connected to or not connected to the fourth opening OP4 based on requirement(s).

Moreover, a sidewall 352a of the first cap 352 and a sidewall 354a of the second cap 354 are combined, so as to serve as at least a portion of the sidewall structure(s) SW of the chamber CB. That is to say, the sidewall 352a of the first cap 352 and the sidewall 354a of the second cap 354 respectively serve as a portion of the spacer. For instance, in FIG. 7, the sidewall structure(s) SW of the chamber CB may be formed of the sidewall 352a of the first cap 352 and the sidewall 354a of the second cap 354.

Furthermore, the first cap 352 and the second cap 354 are respectively configured to protect the first chip 120 and the second chip 140 because the first chip 120 and the second chip 140 are respectively inside the first cap 352 and the second cap 354. The first cap 352 and second cap 354 may include any suitable material, such as metal, glass, silicon, germanium, plastic and/or polymer, but not limited thereto.

The first opening OP1, the second opening OP2, the third opening OP3 and the fourth opening OP4 may be situated at any suitable position. For example, as shown in FIG. 7, the first substrate 110 (i.e., the first wall structure WS1 of the chamber CB) may have the first opening OP1, the second substrate 130 (i.e., the second wall structure WS2 of the chamber CB) may have the second opening OP2, the sidewall 352a of the first cap 352 (i.e., the sidewall structure SW of the chamber CB) may have the third opening OP3, and the sidewall 354a of the second cap 354 (i.e., the sidewall structure SW of the chamber CB) may have the fourth opening OP4, but not limited thereto.

In some embodiments, at least one of the chips CP of the sound producing package structure 300 of this embodiment may be disposed upside down, such that its membrane is closer to the substrate, but not limited thereto.

Optionally, the sound producing package structure 300 may further include at least one mesh 180, wherein the openings (the first opening OP1, the second opening OP2, the third opening OP3 and the fourth opening OP4) may be covered by the mesh 180, such that it is hard for the dust, particles and/or liquid to enter the chamber CB through the openings.

In the following, a manufacturing method of the sound producing package structure 300 according to the third embodiment is explained. In order to explain the manufacturing method more clearly, FIG. 2, FIG. 3, FIG. 7 and FIG. 8 are referred, wherein FIG. 2 shows the flowchart of the manufacturing method of the sound producing package structure 300, FIG. 3 and FIG. 8 show structures at different stages of the manufacturing process of the sound producing package structure 300 according to the third embodiment of the present invention, and FIG. 7 shows the sound producing package structure 300 according to the third embodiment of the present invention after the manufacturing method is accomplished.

In the step ST1_1a of FIG. 2, the first wall structure WS1 (the first substrate 110) is provided (as shown in FIG. 3). Similarly, in the step ST1_1b of FIG. 2, the second wall structure WS2 (the second substrate 130) is provided.

Then, in the step ST1_2a of FIG. 2, the first chip 120 is formed on the first wall structure WS1 (the first substrate 110), wherein the first chip 120 includes the first membrane 122 and the first actuator 126 configured to actuate the first membrane 122 (as shown in FIG. 3). Similarly, in the step ST1_2b of FIG. 2, the second chip 140 is formed on the second wall structure WS2 (the second substrate 130), wherein the second chip 140 includes the second membrane 142 and the second actuator 146 configured to actuate the second membrane 142.

Figure 8:
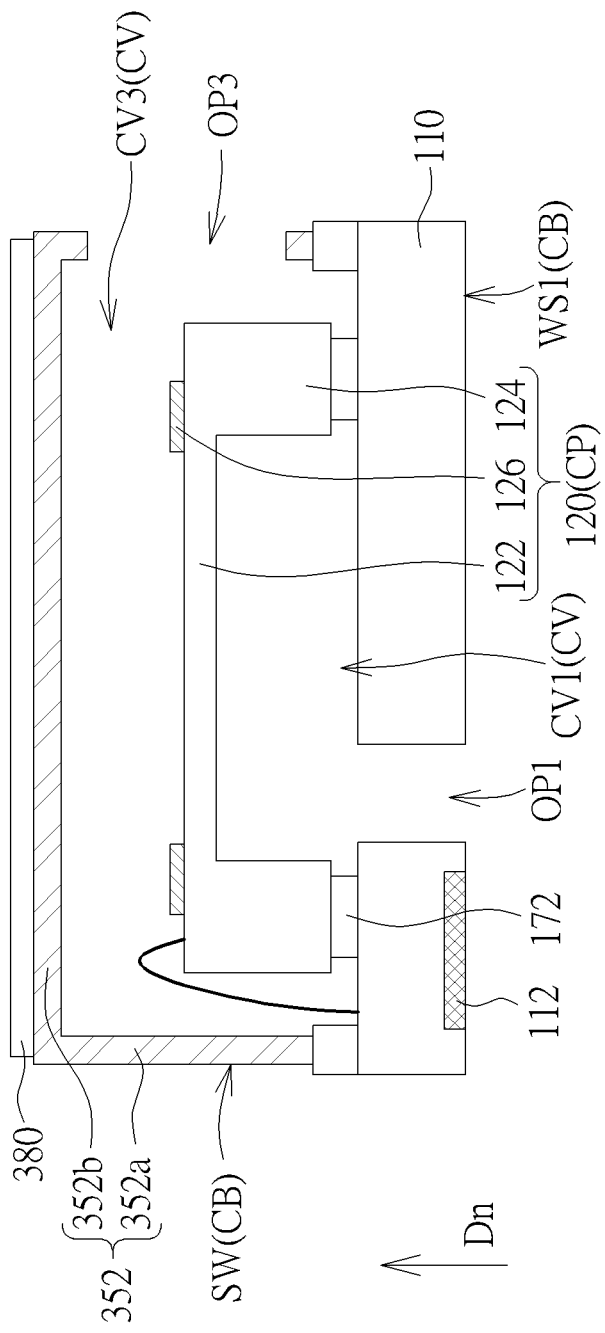
FIG. 8 is a schematic diagram illustrating a structure at a stage of the manufacturing process of the sound producing package structure according to the third embodiment of the present invention.

In the step ST1_3 of FIG. 2, the sidewall structure SW (or at least a portion of the sidewall structure SW) is formed on the first wall structure WS1 (the first substrate 110), as shown in FIG. 8. In this embodiment, since the sidewall 352a of the first cap 352 serves as a portion of the sidewall structure SW, the first cap 352 is formed on the first substrate 110 in this step, wherein the first chip 120 is between the first cap 352 and the first substrate 110, and the first cap 352 may be connected to the first substrate 110 by any suitable adhesive material (i.e., the adhesive component 370 in FIG. 7 and FIG. 8). In addition, the second cap 354 is formed on the second substrate 130, wherein the second chip 140 is between the second cap 354 and the second substrate 130, and the second cap 354 may be connected to the second substrate 130 by any suitable adhesive material (i.e., the adhesive component 370 in FIG. 7). Note that the material, structure and type of the caps can be referred to any suitable embodiment of the present invention, and these will not be redundantly described.

In the step ST1_4 of FIG. 2, the second wall structure WS2 (the second substrate 130) is disposed (formed) on the sidewall structure SW and the first wall structure WS1 (the first substrate 110) to form the chamber CB, wherein the first chip 120 and the second chip 140 are in the chamber CB and between the first wall structure WS1 (the first substrate 110) and the second wall structure WS2 (the second substrate 130), as shown in FIG. 7. In the step ST1_4, the top part 352*b* of the first cap 352 and the top part 354*b* of the second cap 354 are connected to each other through the adhesive layer 380, and the top part 352*b* of the first cap 352 and the top part 354*b* of the second cap 354 are between the third sub-cavity CV3 and the fourth sub-cavity CV4. In FIG. 7, the first substrate 110 may serve as the first wall structure WS1 of the chamber CB, the second substrate 130 may serve as the second wall structure WS2 of the chamber CB, and the sidewall 352*a* of the first cap 352 and the sidewall 354*a* of the second cap 354 may serve as the sidewall structure(s) SW of the chamber CB, but not limited thereto.

Namely, as shown in FIG. 2, FIG. 7 and FIG. 8, the step ST1_4 represents that the second chip 140, the second wall structure WS2 (the second substrate 130) and the second cap 354 are formed on the first wall structure WS1 (the first substrate 110) simultaneously.

Optionally, at least one mesh 180 may be formed to cover the opening(s) of the chamber CB, such that it is hard for the dust, particles and/or liquid to enter the chamber CB through the opening(s).

Figure 9:
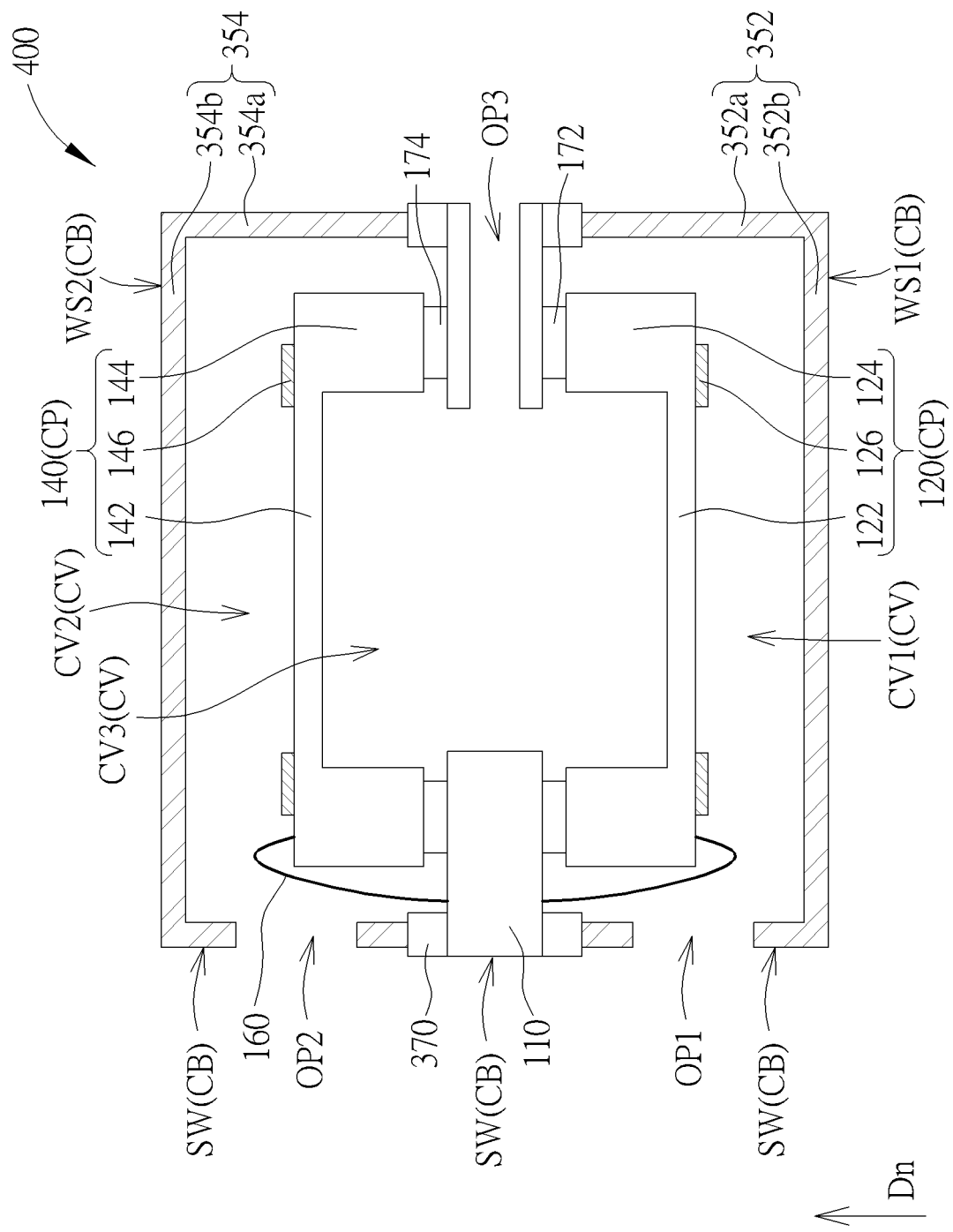
FIG. 9 is a schematic diagram of a cross-sectional view illustrating a sound producing package structure according to a fourth embodiment of the present invention.

Referring to FIG. 9, FIG. 9 is a schematic diagram of a cross-sectional view illustrating a sound producing package structure according to a fourth embodiment of the present invention. As shown in FIG. 9, a difference between this embodiment and the first embodiment is that the first chip 120 and the second chip 140 of the sound producing package structure 400 are connected to the same substrate. In this embodiment, the first chip 120 is connected to the first substrate 110 by the first connecting component 172, the second chip 140 is connected to the first substrate 110 by the second connecting component 174, and the first substrate 110 is between the first chip 120 and the second chip 140. That is to say, the first chip 120 and the second chip 140 are disposed on opposite sides of the first substrate 110.

In FIG. 9, in order to protect the first chip 120 and the second chip 140, the sound producing package structure 400 may further include a first cap 352 and a second cap 354, wherein the first chip 120 is inside the first cap 352, the second chip 140 is inside the second cap 354, and the first cap 352 and the second cap 354 are connected to the first substrate 110 by adhesive components 370. Moreover, the first cap 352 and second cap 354 may include any suitable material, such as metal, glass, silicon, germanium, plastic and/or polymer, but not limited thereto.

In this embodiment, the chamber CB is formed of the first substrate 110, the first cap 352 and the second cap 354. As shown in FIG. 9, the sidewall 352*a* of the first cap 352 serves as a portion of the sidewall structure SW of the chamber CB, the sidewall 354*a* of the second cap 354 serves as a portion of the sidewall structure SW of the chamber CB, the top part 352*b* of the first cap 352 serves as the first wall structure WS1 of the chamber CB, the top part 354*b* of the second cap 354 serves as the second wall structure WS2 of the chamber CB, and the first substrate 110 is disposed between the top part 352*b* of the first cap 352 (i.e., the first wall structure WS1) and the top part 354*b* of the second cap 354 (i.e., the second wall structure WS2), but not limited thereto. In particular, a sidewall of the first substrate 110 may serve as a portion of the sidewall structure SW of the chamber CB, but not limited thereto.

According to the above, as shown in FIG. 9, the first sub-cavity CV1 is between the first membrane 122 of the first chip 120 and the top part 352*b* of the first cap 352 (i.e., the first wall structure WS1), the second sub-cavity CV2 is between the second membrane 142 of the second chip 140 and the top part 354*b* of the second cap 354 (i.e., the second wall structure WS2), and the third sub-cavity CV3 is between the first membrane 122 of the first chip 120 and the second membrane 142 of the second chip 140.

In FIG. 9, the first substrate 110 may have a hole, such that a space between the first membrane 122 and the first substrate 110 and a space between the second membrane 142 and the first substrate 110 may be connected to each other to form the third sub-cavity CV3.

The first opening OP1, the second opening OP2 and the third opening OP3 may be situated at any suitable position of the chamber CB. In some embodiments, the top part 352*b* or the sidewall 352*a* of the first cap 352 has the first opening OP1, and the top part 354*b* or the sidewall 354*a* of the second cap 354 has the second opening OP2. For instance, in FIG. 9, the sidewall 352*a* of the first cap 352 has the first opening OP1, and the sidewall 354*a* of the second cap 354 has the second opening OP2, but not limited thereto. In particular, as shown in FIG. 9, a vent at the sidewall of the first substrate 110 serves as the third opening OP3 of the chamber CB to be connected to the third sub-cavity CV3, wherein this vent may be formed by etching one layer or some layers in the first substrate 110, but not limited thereto. For instance, the vent may horizontally extend from the sidewall of the first substrate 110 to the third sub-cavity CV3.

In some embodiments, at least one of the chips CP of the sound producing package structure 400 of this embodiment may be disposed upside down, such that its membrane is closer to the substrate, but not limited thereto.

Optionally, the sound producing package structure 400 may further include at least one mesh 180, wherein the openings (the first opening OP1, the second opening OP2 and the third opening OP3) may be covered by the mesh 180, such that it is hard for the dust, particles and/or liquid to enter the chamber CB through the openings.

In this embodiment, since the sound producing package structure 400 shown in FIG. 9 needs only one substrate, the size of the sound producing package structure 400 may be reduced.

Figure 10:
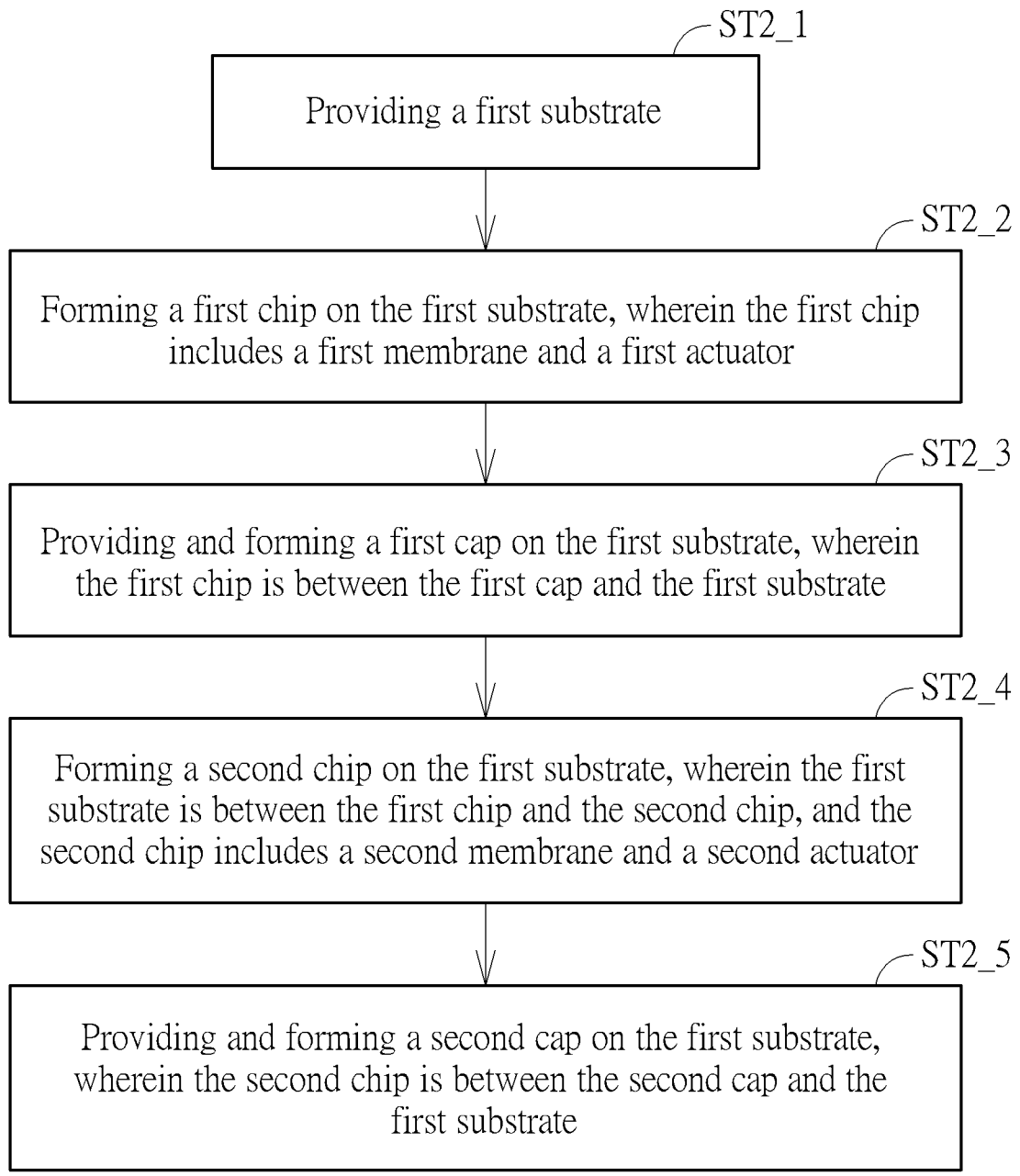
FIG. 10 is a schematic diagram showing a flowchart of a manufacturing method of a sound producing package structure according to another embodiment of the present invention.

Referring to FIG. 10, FIG. 10 is a schematic diagram showing a flowchart of a manufacturing method of a sound producing package structure according to another embodiment of the present invention. It is to be appreciated that the flowchart shown in FIG. 10 is exemplary. In some embodiments, some of the steps may be performed simultaneously, or in a different order than shown in FIG. 10. In some embodiments, before or after one of the existing step of the manufacturing method shown in FIG. 10, any other suitable step may be added. Regarding the following contents, the manufacturing method shall be described with reference to FIG. 10. However, the manufacturing method is not limited to those example embodiments.

Figure 11:
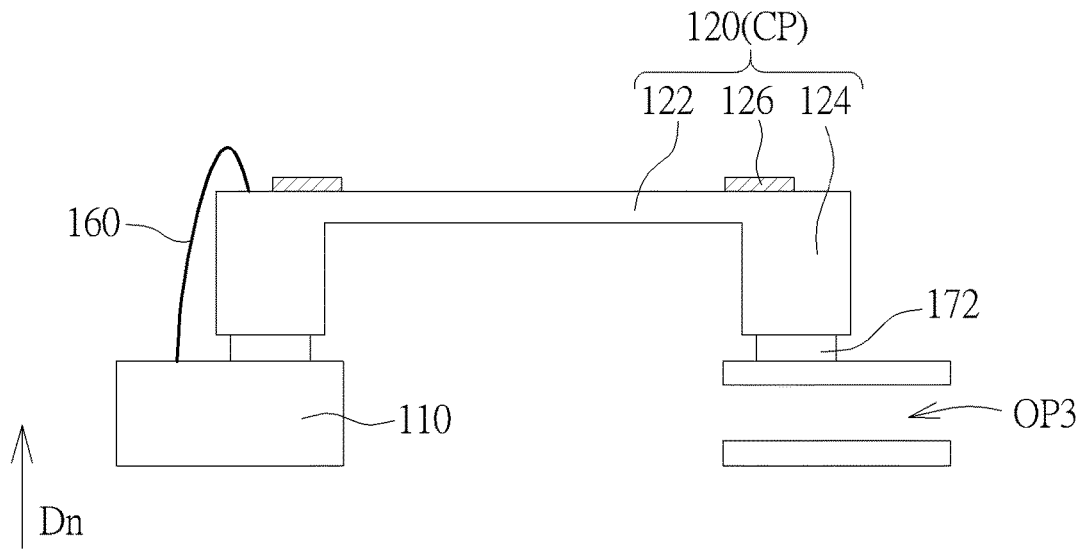
FIG. 11 to FIG. 13 are schematic diagrams illustrating structures at different stages of the manufacturing process of the sound producing package structure according to the fourth embodiment of the present invention.
Figure 12:
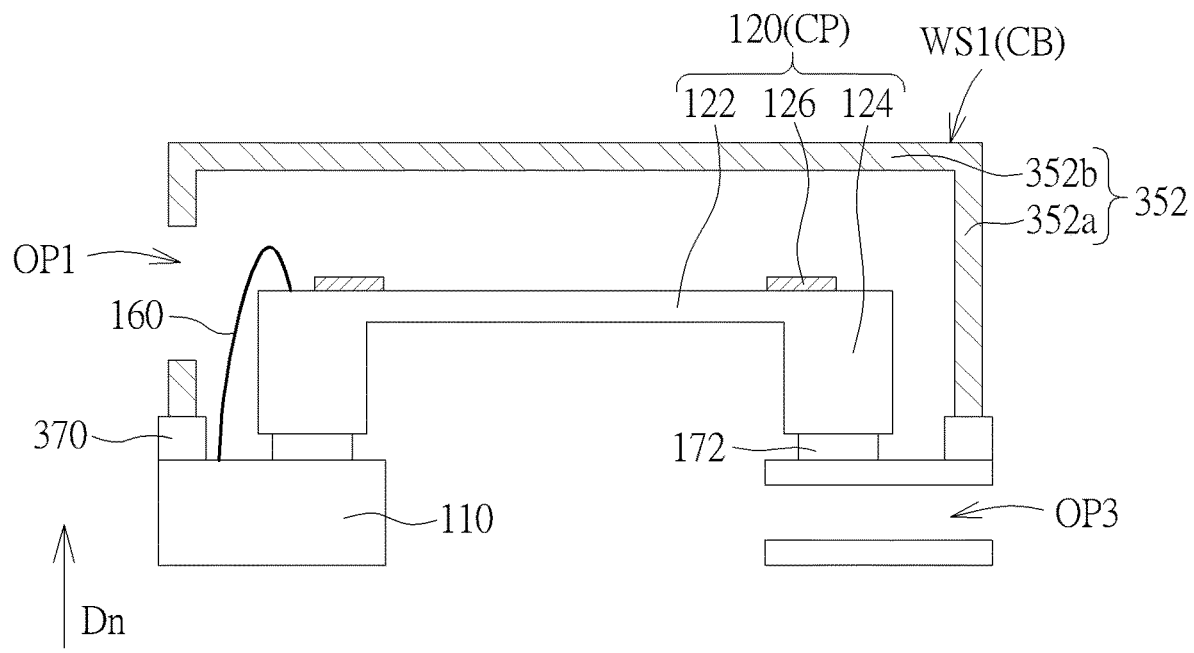
Figure 13:
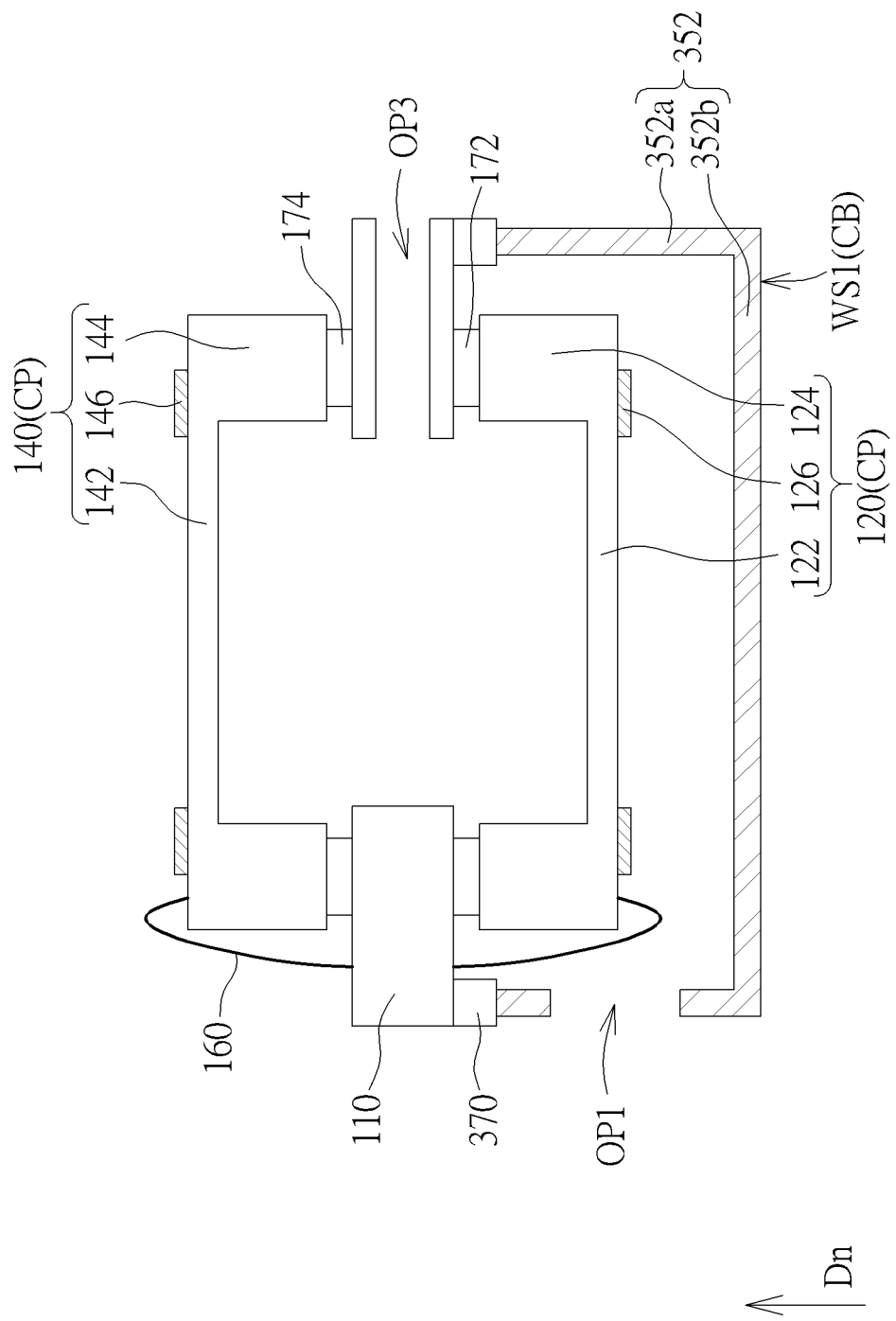

In order to explain the manufacturing method more clearly, FIG. 11 to FIG. 13 and FIG. 9 are referred to further, wherein FIG. 11 to FIG. 13 are schematic diagrams illustrating structures at different stages of the manufacturing process of the sound producing package structure 400 according to the fourth embodiment of the present invention, and FIG. 9 shows the sound producing package structure 400 according to the fourth embodiment of the present invention after the manufacturing method is accomplished.

In the step ST2_1 of FIG. 10, the first substrate 110 is provided (as shown in FIG. 11).

In the step ST2_2 of FIG. 10, the first chip 120 is formed on the first substrate 110, wherein the first chip 120 includes the first membrane 122 and the first actuator 126 configured to actuate the first membrane 122 (as shown in FIG. 11).

In the step ST2_3 of FIG. 10, the first cap 352 is provided and formed on the first substrate 110, wherein the first chip 120 is between the first cap 352 and the first substrate 110 (as shown in FIG. 12). In this embodiment, the top part 352b of the first cap 352 serves as the first wall structure WS1.

Namely, as shown in FIG. 10 and FIG. 12, the step ST2_3 represents that the first wall structure WS1 is provided and the first chip 120 is formed on the first wall structure WS1 (the top part 352b of the first cap 352).

In the step ST2_4 of FIG. 10, the second chip 140 is formed on the first substrate 110, wherein the first substrate 110 is between the first chip 120 and the second chip 140, and the second chip 140 includes the second membrane 142 and the second actuator 146 configured to actuate the second membrane 142 (as shown in FIG. 13). Note that, before the step ST2_4, the structure shown in FIG. 12 may be rotated to make the surface of the first substrate 110 opposite to the first chip 120 face upwardly.

Namely, as shown in FIG. 10 and FIG. 13, the step ST2_4 represents that the second chip 140 is formed on the first substrate 110 when forming the second chip 140 on the first wall structure WS1 (the top part 352b of the first cap 352).

In the step ST2_5 of FIG. 10, the second cap 354 is provided and formed on the first substrate 110, wherein the second chip 140 is between the second cap 354 and the first substrate 110, the first substrate 110 is between the first cap 352 and the second cap 354, the chamber CB is formed and includes the first substrate 110, the first cap 352 and the second cap 354, and the first chip 120 and the second chip 140 are inside the chamber CB (as shown in FIG. 9). In this embodiment, the top part 354b of the second cap 354 serves as the second wall structure WS2.

Namely, as shown in FIG. 9 and FIG. 10, the step ST2_5 represents that the second wall structure WS2 (the top part 354b of the second cap 354) is formed on the first substrate 110 when forming the second wall structure WS2 (the top part 354b of the second cap 354) on the first wall structure WS1 (the top part 352b of the first cap 352).

Optionally, at least one mesh 180 may be formed to cover the opening(s) of the chamber CB, such that it is hard for the dust, particles and/or liquid to enter the chamber CB through the opening(s).

In summary, according to the present invention, the yield rate and the reliability of the sound producing package structure are enhanced, and the size of the sound producing package structure is reduced. In some cases, the sound pressure level of the acoustic wave produced by the sound producing package structure may be enhanced since the sound producing package structure includes a plurality of chips configured to produce the acoustic wave.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sound producing package structure, comprising:
   a plurality of chips, disposed within a cavity, the plurality of chips comprising:
      a first chip comprising a first sound producing membrane and a first actuator attached to the first sound producing membrane; and
      a second chip comprising a second sound producing membrane and a second actuator attached to the second sound producing membrane;
   wherein the first sound producing membrane and the second sound producing membrane are actuated toward a center of the cavity in a synchronous fashion so as to produce a sound pressure.

2. The sound producing package structure of claim 1,
   wherein the cavity is divided into a plurality of sub-cavities by the plurality of chips, the plurality of sub-cavities comprise a first sub-cavity, a second sub-cavity and a third sub-cavity, the first sound producing membrane of the first chip is between the first sub-cavity and the third sub-cavity, and the second sound producing membrane of the second chip is between the second sub-cavity and the third sub-cavity;
   wherein the sound producing package structure further comprises a first opening, a second opening and a third opening, the first opening is connected to the first sub-cavity, the second opening is connected to the second sub-cavity, and the third opening is connected to the third sub-cavity.

3. The sound producing package structure of claim 2, further comprising:
   a chamber comprising a first wall structure, a second wall structure and a sidewall structure, wherein the second wall structure is opposite to the first wall structure, the sidewall structure is between the first wall structure and the second wall structure, and the cavity exists within the chamber;
   wherein the sidewall structure has the third opening.

4. The sound producing package structure of claim 2, further comprising:
   a chamber comprising a first wall structure, a second wall structure and a sidewall structure, wherein the second wall structure is opposite to the first wall structure, the sidewall structure is between the first wall structure and the second wall structure, and the cavity exists within the chamber;
   wherein the first wall structure or the sidewall structure has the first opening, and the second wall structure or the sidewall structure has the second opening.

5. The sound producing package structure of claim 2, wherein the first sound producing membrane and the second sound producing membrane have direct contact with the third sub-cavity.

6. The sound producing package structure of claim 2, wherein the plurality of sub-cavities further comprise a fourth sub-cavity, the third sub-cavity and the fourth sub-cavity are between the first sound producing membrane and the second sound producing membrane, the first sound producing membrane has direct contact with the third sub-cavity, and the second sound producing membrane has direct contact with the fourth sub-cavity.

7. The sound producing package structure of claim 6, further comprising a first cap and a second cap, wherein the first chip is inside the first cap, the second chip is inside the second cap, and a top part of the first cap and a top part of the second cap are between the third sub-cavity and the fourth sub-cavity.

8. The sound producing package structure of claim 6, further comprising a fourth opening connected to the fourth sub-cavity.

9. The sound producing package structure of claim 1, further comprising:
   a chamber comprising a first wall structure, a second wall structure and a sidewall structure, wherein the second wall structure is opposite to the first wall structure, the sidewall structure is between the first wall structure and the second wall structure, and the cavity exists within the chamber;

wherein the first chip is connected to the first wall structure by a first connecting component, the second chip is connected to the second wall structure by a second connecting component.

10. The sound producing package structure of claim 1, further comprising:
  a chamber comprising a first wall structure, a second wall structure and a sidewall structure, wherein the second wall structure is opposite to the first wall structure, the sidewall structure is between the first wall structure and the second wall structure, and the cavity exists within the chamber; and
  a first substrate disposed between the first wall structure and the second wall structure, wherein the first chip is connected to the first substrate by a first connecting component, the second chip is connected to the first substrate by a second connecting component, and the first substrate is between the first chip and the second chip.

11. The sound producing package structure of claim 10, wherein a sidewall of the first substrate serves as a portion of the sidewall structure, and a vent exists at the sidewall of the first substrate to be connected to a sub-cavity of the cavity between the first sound producing membrane and the second sound producing membrane.

12. The sound producing package structure of claim 10, further comprising a first cap and a second cap, wherein the first chip is inside the first cap, the second chip is inside the second cap, a sidewall of the first cap and a sidewall of the second cap serve as at least a portion of the sidewall structure, a top part of the first cap serves as the first wall structure, and a top part of the second cap serves as the second wall structure.

13. The sound producing package structure of claim 12, wherein the first cap and the second cap are connected to the first substrate.

14. The sound producing package structure of claim 1, wherein the first sound producing membrane overlaps the second sound producing membrane in a normal direction of the first sound producing membrane.

15. The sound producing package structure of claim 1, further comprising:
  a chamber comprising a first wall structure, a second wall structure and a sidewall structure, wherein the second wall structure is opposite to the first wall structure, the sidewall structure is between the first wall structure and the second wall structure, and the cavity exists within the chamber;
  wherein the sidewall structure comprises a connecting trace electrically connected between a conductive component of the first wall structure and a conductive component of the second wall structure.

\* \* \* \* \*